United States Patent [19]

Baker

[11] Patent Number: 5,084,128
[45] Date of Patent: Jan. 28, 1992

[54] LOW-TEMPERATURE SYNTHESIS OF GROUP III-GROUP V SEMICONDUCTORS

[75] Inventor: Ralph T. Baker, Wilmington, Del.

[73] Assignee: E.I. Du Pont de Nemours and Company, Wilmington, Del.

[21] Appl. No.: 580,476

[22] Filed: Oct. 23, 1990

[51] Int. Cl.[5] .................................... C30B 11/00
[52] U.S. Cl. ............................ 156/614; 156/603; 156/610; 156/613; 156/621; 156/624; 156/DIG. 71; 156/DIG. 111; 427/248.1; 427/255.1; 437/81; 556/1; 556/27; 556/64
[58] Field of Search ............... 156/603, 610, 613, 614, 156/621, 624, DIG. 71, DIG. 111; 252/62.3 GA; 427/248.1, 255.1; 437/81; 556/1, 27, 64

[56] References Cited

U.S. PATENT DOCUMENTS

| | | | |
|---|---|---|---|
| 3,175,975 | 3/1965 | Fuller | 252/62.3 |
| 3,309,176 | 3/1967 | Mayer | 23/204 |
| 3,647,578 | 3/1972 | Barnett et al. | 148/171 |
| 3,767,472 | 10/1973 | Chicotka et al. | 148/1.6 |
| 3,947,549 | 3/1976 | Born et al. | 423/299 |
| 4,436,769 | 3/1984 | Moss et al. | 427/252 |
| 4,716,130 | 12/1987 | Johnson, Jr. et al. | 437/104 |
| 4,833,103 | 5/1989 | Agostinelli et al. | 437/231 |

FOREIGN PATENT DOCUMENTS 1001144  8/1965  United Kingdom ....... 252/62.3 GA
1180314  2/1970  United Kingdom .

OTHER PUBLICATIONS

A. H. Cowley et al., Agnew. Chem. Int. Ed. Engl. 28, pp. 1208–1215, 1989, Single-Source III/V Precursors: A New Approach to Gallium Arsenide and Related Semiconductors.

Howard M. Manasevit, Appl. Phys. Lett., vol. 12, No. 4, pp. 156–159, 1968, Single-Crystal Gallium Arsenide on Insulting Substrates.

Crowley et al., J. Amer. Chem. Soc., vol. 110, pp. 6248–6249, 1988, Organometallic Chemical Vapor Deposition of III/V Compound Semiconductors with Novel Organometallic Precursors.

Primary Examiner—Robert Kunemund
Assistant Examiner—Felisa Garrett
Attorney, Agent, or Firm—William H. Hamby

[57] ABSTRACT

This invention relates to a low-temperature process for the preparation of group III-group V semiconducting material. More particularly, in the present process at least one group III compound is reacted with at least one group V compound in an aprotic solvent to form a precursor, which is then heated to form the semiconducting material.

10 Claims, 1 Drawing Sheet 5,084,128

LOW-TEMPERATURE SYNTHESIS OF GROUP III-GROUP V SEMICONDUCTORS

FIELD OF THE INVENTION

This invention relates to a low-temperature process for the preparation of group III-group V semiconducting material.

BACKGROUND OF THE INVENTION

The term "III-V semiconductors" is used to describe crystalline materials or solid solutions formed from substantially equimolar amounts of at least one element from group IIIb of the Periodic Table of the Elements (B, Al, Ga, In, and Tl) and at least one element from group Vb, of the Periodic Table of the Elements (N, P, As, Sb, and Bi).

Several III-V semiconductors exhibit feature which make them attractive for use in solid state electronic devices (e.g., high thermal stability, high electron mobility, and low band gap). However, the III-V semiconductors are more difficult to synthesize than the widely used group IV semiconductors, and the lack of suitable routes to the III-V compounds has hindered their acceptance as alternates to the group IV compounds.

C. Hilsum et al., "Semiconducting III-V Compounds", Pergamon Press, New York, 1961, review the preparation of many III-V semiconductors by direct combination of the elements. Although this method is applicable to the synthesis of several III-V compounds, special equipment and techniques are required to safely handle the high temperatures and/or high pressures encountered in synthesis. A. H. Cowley et al., Angew. Chem. Int. Ed. Engl., 28, 1208 (1989). U.S. Pat. No. 3,309,176 discloses a route to III-V compounds comprising heating an intimate mixture of the elements with a small amount of halogen gas in a closed and (partially) evacuated vessel. Preferably, the temperature of the reaction zone is between 550° C. and U.S. Pat. No. 3,947,549 disclose the preparation of III-V materials (AlN, InN, InP, and GaN) by reacting a hydride of nitrogen or phosphorus with a halide of Al, In, or Ga in the gas phase at a temperature below the decomposition temperature of the III-V material. The temperature of the reaction is at least 400° C.

British Pat. No. 1,180,314 discloses a process for the production of GaAs, which comprises contacting a pulverous gallium alkoxy halide with arsine at a temperature in the range of from 300 to 800° C.

Recently, metal-organic chemical vapor deposition (MOCVD) routes to III-V semiconductor thin films have become increasingly attractive, due largely to the high growth rates, high purity, high crystal quality, and ease of process control. MOCVD involves impinging a stream of cool gaseous reactants (e.g., trimethyl gallium and arsine), usually in admixture with a carrier gas (e.g., hydrogen), onto a hot substrate to form the III-V semiconductor. (See, for example, Manasevit, Appl. Phys. Lett., Vol. 12, p 156, 1968.)

U.S. Pat. No. 4,436,769 disclose a method of depositing a group III element-group V element compound or alloy on a hot substrate using a MOCVD procedure. This procedure uses a modified alkyl derivative of the group III element, wherein either an electron donating group is substituted for one of the alkyl groups of the group III compound or the group III element alkyl derivative is combined with an alkyl derivative of a group V element to form a volatile compound. The temperature of the substrate is typically between 600° C. and 700° C.

U.S. Pat. No. 4,716,130 discloses an MOCVD process which uses ferrocene or iron pentacarbonyl based compounds in the preparation of semi-insulating epitaxial layers of InP-based compounds. The substrate was heated to 650° C. to 700° C.

Cowley et al., J. Amer. Chem. Soc., Vol. 110, pp 6248-6249, 1988, disclose organometallic chemical vapor deposition of III/V compound semiconductors. For example, [Me$_2$Ga($\mu$-t-Bu$_2$As)]$_2$ is used as the single source for the production of GaAs films. Film growth conditions involve the use of a cold-wall reactor, H$_2$ or He as the carrier gas, maintenance of the saturator containing the organometallic source at 130° C. substrate temperatures of 450 to 700° C., and a total system pressure of $1 \times 10^{-4}$ to 10 torr.

These methods for preparing III-V semiconductors reviewed herein either require high temperatures in the gaseous reaction zone or of the substrate, or are specific to only one species of III-V compound.

It is an object of the present invention to provide a low temperature synthesis of semiconducting group III-group V material. It is a further object of the present invention to provide a semiconducting group III-group V material useful to form semiconductors having utility in solid state electronics and other fibers. A feature of the present invention is its applicability to group III-group V semiconductors including one or more elements selected from each group. An advantage of the present invention is the ability to form semiconductors without employing high temperatures to the reactants or to a substrate. These and other objects, features, and advantages of the present invention will become more readily understood and appreciated upon having reference to the following description of the invention.

SUMMARY OF THE INVENTION

This invention resides in a process for the preparation of a group III-group V compound comprising:

(a) reacting at least one group III compound independently selected from the group consisting of M(ER$_2$)$_3$ and Al(PR'$_2$)$_3$, wherein
M = Ga or In;
E = P or As;
R = t-C$_4$H$_9$, CH[Si(CH$_3$)$_3$]$_2$ or Si(CH$_3$)$_3$,
R' = i-C$_3$H$_7$, CH$_2$C(CH$_3$)$_3$, CH$_2$Si(CH$_3$)$_3$ or C$_6$H$_{12}$,
with at least one group V compound independently selected from EH$_3$, where E = P, As, or Sb, in an aprotic solvent to form a precursor; and (b) heating the precursor to a temperature of up to 400° C., sufficient to form a semiconducting group III-group V material.

Detailed Description of the Invention

Figure 1:
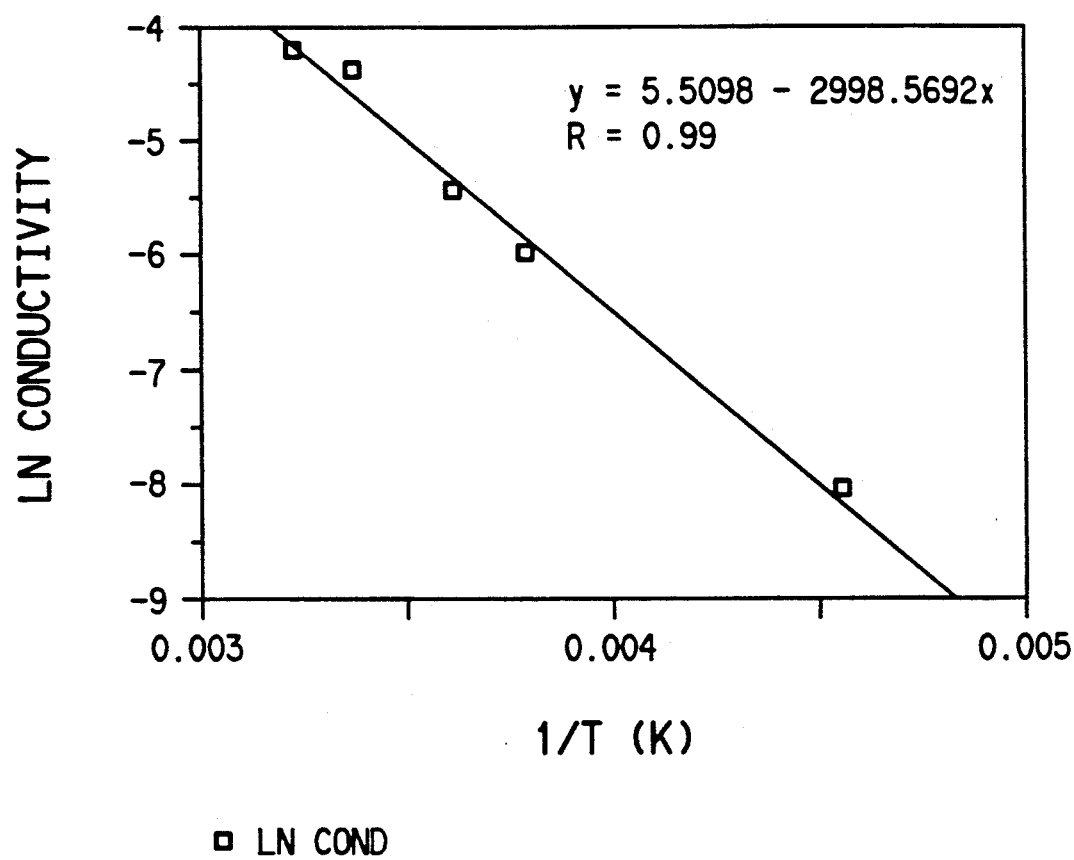
FIG. 1 is a graph of In (conductivity) as a function of (temperature)[1] for a pressed pellet of InP prepared as in Example 1.

The process of this invention is a low-temperature route to semiconducting material, and in particular III-V semiconductors, in which a soluble, alkyl- or silyl-substituted group III monomeric trisphosphide or trisarsenide is reacted with a group V hydride in solution at or below ambient temperature to give an insoluble, presumably polymeric, material which is then isolated and heated to moderate temperatures to eliminate the alkyl and/or silyl groups and form the desired III-V semiconductor.

Suitable group III monomeric trisphosphides and trisarsenides are those of the formula $M(ER_2)_3$ or $Al(PR'_2)_3$, where M is Ga or In, E is P or As, R is independently chosen from $t-C_4H_9$, $CH[Si(CH_3)_3]_2$ and $Si(CH_3)_3$, and R' is independently chosen from $i-C_3H_7$, $CH_2C(CH_3)_3$, $CH_2Si(CH_3)_3$, and $C_6H_{12}$. $Ga[P(t-C_4H_9)_2]_3$ and $In[P(t-C_4H_9)_2]_3$ are preferred trisphosphides.

The preparation of $Ga[E(t-C_4H_9)_2]_3$ by the reaction of $GaCl_3$ with $LiE(t-C_4H_9)_2$ (E = P or As) at $-78°$ C. has been disclosed by Arif et al., J. Chem. Soc., Chem. Commun., 1986, pp 1543-1545. Other group III trisphosphides and trisarsenides can be prepared in a similar manner, using the appropriate anhydrous metal halide and lithium reagent.

Suitable group V hydrides include $PH_3$, $AsH_3$, and $SbH_3$, which are commercially available. $PH_3$ is preferred. Suitable aprotic solvents include ethers and other polar species which are not strongly coordinating, as well as relatively non-polar solvents such as aliphatic and aromatic hydrocarbons. Toluene is a preferred solvent.

The process of this invention is typically carried out by dissolving the group III trisphosphide or trisarsenide in a suitable dry, oxygen-free solvent at ambient temperature under conditions which exclude water and oxygen. The resulting solution is then exposed to the group V hydride, either by bubbling the group V compound through the solution, or preferably by simply connecting the reaction vessel to a balloon inflated with the group V hydride (which is a gas under the reaction conditions). After stirring for 1-3 hours, the solid or gel which is formed in the reaction vessel is then isolated by filtration and vacuum-dried to give the semiconductor precursor as an air-sensitive powder, which varies in color from yellow to orange to red. The powder is insoluble in all solvents with which it does not react.

The powders are complex mixtures of III-V compounds which contain varying amounts of unreacted alkyl- or silyl-phosphide (or arsenide) groups. Exposure of the powders to prolonged high vacuum, even at 25° C., results in gradual loss of dialkyl phosphines (or arsines) and $PH_3$ (or $AsH_3$). In addition, the color of the powder changes from yellow, orange or red to black as the weight of the powder decreases. Changes are also observed in the $^{31}P$ NMR and IR spectra on exposure of the powders to high vacuum.

Heating the powders results in more rapid and continuous weight loss from about 50° C. to about 400° C. The total weight loss depends on the composition of the precursor. Preferably, the powders are heated from about 350° C. to about 400° C. to give lustrous gray or black semiconducting solids which may appear to be either amorphous or crystalline. Preferably, the precursor powders are heated for 1-2 hours.

The semiconducting properties of the solids can be confirmed by demonstrating that conductivity increases with temperature and by estimating the band gap energies from UV-VIS reflectance spectra.

This process is suitable for preparing both simple III-V semiconductors (i.e., those containing only one group III element and only one group V element) and mixed III-V semiconductors (i.e., those with more than one group III element and/or more than one group V element). To further illustrate various properties of composition of the present invention, the following discussion relates to the treatment of $M[P(t-C_4H_9)_2]_3$ (M = Ga, In) with $EH_3$ (E = P, As) in suitable solvent. Monitoring the reaction by $^{31}P$ NMR spectroscopy at 25° C. shows only the formation of $P(t-C_4H_9)_2H$. Elemental analytical results and solid state $^{31}P$ NMR studies indicated that the reaction is complex and that the product had a group V-III ratio of 1.5-1.8 with approximately 0.3 unreacted $P(t-C_4H_9)_2$ groups per M atom. The solid state infrared spectrum contains a broad absorption at ca. 2260[2060] cm$^{-1}$ due to the P-H[As-H] functionality, but the relative proportions of P, Ph and $PH_2$ groups could not be ascertained. The details for several systems are given in Table I. In order to gauge the relative reactions of Ga vs. In and P vs. As, an equimolar mixture of Ga- and $In[P(t-C_4H_9)_2]_3$ was reacted with a 1:1 mixture of $PH_3$ and $AsH_3$.

The TGA data for the powders indicated continuous weight loss from the outset (40° C.). The elemental analysis for the M = In, E = P product (Table I) indicated a 9% weight loss on transformation from the red-orange to the black powder and the IR spectrum of the latter was featureless.

The TGA data for the polymer precursors in the InP and GaAs systems both showed a continuous weight loss (ca. 12% total) from 50 to 300° C. Consequently, the powders were heated in vacuo at 350-400° C. to obtain lustrous gray or black solids. Analysis of the volatiles for the InP system indicated $PH_3$, $P(t-C_4H_9)_2H$ (56:36) and a minor percentage of $P_4$ (4%). Elemental analysis and X-ray diffraction results showed that the InP was crystalline, >99% pure and had a group V-III ratio of 1.04, while the GaAs contained ca. 2.5% C and had a group V-III ratio of 1.4. Intermediate results were obtained for GaP and $GaIn-As_2$, although the latter was amorphous. The semiconducting nature of the obtained solids is demonstrated by the increase in conductivity with temperature and by the band gap energies which were estimated from the UV-VIS reflectance spectra.

TABLE I

| Synthetic Details[a] and Characterization of the Polymer Precursors | | | | | | | | | |
|---|---|---|---|---|---|---|---|---|---|
| Amt. | | | | | Elemental Analysis | | | | |
| $M[P(t-C_4H_9)_2]_3$ | $EH_3$ | Solvent | Yield | Color | % M | % E | % C | % H | Total |
| 2.6 g | In  P | 300 mL $Et_2O$ | 936 mg | rust | 57.0 | 24.3 | 13.81 | 3.21 | 98.4 |
| (4.7 mmol) | | | | | 57.0 | 24.6 | 13.79 | 3.17 | |
| 1.2 g | In  P | 100 mL THF | 370 mg | black | 60.6 | 23.3 | 9.88 | 2.40 | 96.2 |
| (2.2 mmol) | | | | | | | | | |
| 2.4 g | Ga  As | 100 mL $Et_2O$ | 975 mg | red-orange | 26.3 | 51.4 | 11.29 | 2.74 | 91.6 |
| (4.7 mmol) | | | | | 26.3 | 51.2 | 11.21 | 2.71 | |
| 600 mg | Ga  P | 25 mL benzene | 160 mg | yellow | 48.3 | 35.6 | 12.50 | 3.21 | 99.3 |
| (1.1 mmol) | | | | | 48.4 | 35.1 | 12.20 | 3.24 | |
| 1.01 g | In  P/As | 50 mL THF | 891 mg | black | 14.6, 14.8/ | 7.04, 6.81/ | 12.92 | 2.86 | 98.8 |
| Ga/1.10 g | | | | | 24.7, 24.9 | 36.7, 36.7 | 12.78 | 2.77 | |

TABLE I-continued

| | Synthetic Details[a] and Characterization of the Polymer Precursors | | | | | | | |
|---|---|---|---|---|---|---|---|---|
| Amt. | | | | | Elemental Analysis | | | |
| $M[P(t-C_4H_9)_2]_3$  $EH_3$ | Solvent | Yield | Color | % M | % E | % C | % H | Total |
| Formula[b] | Formula[c] | | IR[d] (cm$^{-1}$) | | | | | |
| $InP_{1.6}C_{2.3}H_{6.4}$ | $InP_{1.3}H_{0.8}[P(t-C_4H_9)_2]_{0.3}$ | | 2260(m, br), 11.60(m, br), 1041(s), 1021(s), 720(m) | | | | | |
| $InP_{1.4}C_{1.6}H_{4.5}$ | $InP_{1.2}H_{1.0}[P(t-C_4H_9)_2]_{0.2}$ | | — | | | | | |
| $GaAs_{1.8}C_{2.5}H_{7.2}$ | $GaAs_{1.8}H_{1.6}[P(t-C_4H_9)_2]_{0.3}$ | | 2062(m, br), 1153(w), 1104(m), 1093(m), 1056(s), 723(m) | | | | | |
| $GaP_{1.7}C_{1.5}H_{4.6}$ | $GaP_{1.5}H_{3.7}[P(t-C_4H_9)_2]_{0.2}$ | | — | | | | | |
| $GaInAs_{2.3}P_{1.0}C_{4.7}H_{13.2}$ | $GaInAs_2 P_{0.4}H_{4.1}[P(t-C_4H_9)_2]_{0.6}$ | | — | | | | | |

All solvents were distilled from sodium benzophenone-ketyl. Reactions were conducted in a Schlenk flask inside a nitrogen-filled glove box. A balloon was attached to the ground glass joint and inflated through the sidearm with $PH_3$ or $AsH_3$. After 1-3 hours, the resulting precipitate was filtered off, washed with fresh solvent and dried in vacuo for 15-30 minutes.
The formula was determined by atomic weight normalization of the experimental values; formula' was calculated by assuming that all carbon devices from unreacted $P(t-C_4H_9)_2]$ groups
IR spectra were recorded as mineral oil mulls on CsI plates using a Perkin Elmer 983 spectrometer.
EO refers to samples that were evacuated overnight on the high vacuum line.

The following examples are intended to illustrate the invention and are not meant to limit the invention. In the examples, temperatures are given in degrees Celsius. All solvents were distilled from sodium benzophenone ketyl. Preparations of the semiconductor precursors were conducted in a nitrogen-filled glove box. IR spectra were recorded as mineral oil mulls on CsI plates using a Perkin Elmer 983 spectrometer. Band gap energies were estimated from the UV-VIS reflectance spectra.

EXAMPLE 1

A solution of $In[P(t-C_4H_9)_2]_3$ (5.6 g, 10.2 mmol) in tetrahydrofuran (75 mL) in a Schlenk flask was stirred rapidly as $PH_3$ gas was added from a balloon attached to a side-arm of the Schlenk flask. After 4 h, the resulting orange precipitate was filtered off, washed with $2 \times 10$ mL of pentane and dried in vacuo to constant weight. The resulting black powder (1.69 g) was then heated in vacuo to 375° C. for 1 h to give grey, crystalline indium phosphide (1.34 g). The powder was pressed into pellets according to techniques readily understood by those skilled in the art. Elemental analysis was consistent with a compound of the formula $InP_{1.04}C_{0.05}$. X-ray diffraction peaks were measured at 51.8°, 43.8°, and 26.8° ($W_{\frac{1}{2}}=0.5$.). The band gap energy was estimated to be 1.24 eV. A graph of ln(conductivity) vs. $T^{-1}$ is shown in FIG. 1 and illustrates the semiconducting properties of this sample of indium phosphide.

EXAMPLE 2

A solution of $Ga[P(t-C_4H_9)_2]_3$ (2.4 g, 4.7 mmol) in $(CH_3CH_2)_2O$ (100 mL) in a Schlenk flask was stirred rapidly as $AsH_3$ gas was added from a balloon attached to a side-arm of the Schlenk flask. After 0.5 h, the resulting red-orange precipitate was filtered off, washed with ether and dried in vacuo to constant weight (893 mg). The filtrate was isolated and stirred under $AsH_3$ to give an additional 60 mg of orange solids.

A sample of similarly prepared vacuum-dried brown GaAs precursor (527 mg) was heated in vacuo to 320° C. for 1 h to give metallic silver-colored semicrystalline gallium arsenide (232 mg). Elemental analysis was consistent with a compound of the formula $GaAs_{1.4}C_{0.4}H_{0.9}$. X-ray diffraction peaks were measured at 48.0° (br, $W_{\frac{1}{2}} \sim 9°$) and 28.5° (br, $W_{\frac{1}{2}} \sim 6°$).

EXAMPLE 3

A red solution of $Ga[P(t-C_4H_9)_2]_3$ (600 mg, 1.1 mmol) in benzene (25 mL) in a Schlenk flask was stirred rapidly as $PH_3$ gas was added from a balloon attached to a side-arm of the Schlenk flask. After stirring overnight, the resulting precipitate was filtered off, washed with benzene and dried in vacuo to constant weight to give a dull yellow solid (160 mg). The powder was heated in vacuo to 400° C. for about 0.5 h to give black semicrystalline gallium phosphide (61 mg). Elemental analysis was consistent with a compound of the formula $GaP_{1.3}C_{0.1}H_{0.1}$. X-ray diffraction peaks were measured at 51.0° and 29.2° (v br). The band gap energy was estimated to be 1.38 eV.

EXAMPLE 4

A red solution of $Ga[P(t-C_4H_9)_2]_3$ (1.01 g) and $In[P(t-C_4H_9)_2]_3$ in tetrahydrofuran (50 mL) in a Schlenk flask was stirred rapidly as a mixture of $PH_3$ gas and $AsH_3$ gas was added to the Schlenk flask. After stirring for 3 h, the resulting precipitate was filtered off, washed with tetrahydrofuran and dried in vacuo to constant weight to give a glossy black solid (891 mg). The black solid was heated in vacuo to 380° C. for about 1 h to give grey-black amorphous III/V semiconductor (61 mg). Elemental analysis was consistent with a compound of the formula $GaInAs_2P_{0.6}C_{0.2}H_{0.4}$, indicating that arsine reacts more rapidly than $PH_3$ with the gallium- and indium-phosphides.

What is claimed is:

1. A process for the preparation of a group III-group V compound comprising:
    (a) reacting at least one group III compound independently selected from the group consisting of $M(ER_2)_3$ and $Al(PR'_2)_3$, wherein
    M = Ga or In;
    E = P or As;
    R = t-$C_4H_9$, $CH[Si(CH_3)_3]_2$ or $Si(CH_3)_3$,
    R' = i-$C_3H_7$, $CH_2C(CH_3)_3$, $CH_2Si(CH_3)_3$ or $C_6H_{12}$,
    with at least one group V compound independently selected from $EH_3$, where E' = P, As, or Sb, in an aprotic solvent to form a precursor; and
    (b) heating the precursor to a temperature up to 400° C. sufficient to form a semiconducting group III-group V material.

2. The process of claim 1 wherein $M(ER_2)_3$ is $Ga[P(t-C_4H_9)_2]_3$ or $In[P(t-C_4H_9)_2]_3$.

3. The process of claim 1 wherein $E'H_3$ is $PH_3$.

4. The process of claim 1 wherein the aprotic solvent is selected from the group consisting of ethers, aliphatic hydrocarbons, and aromatic hydrocarbons.

5. The process of claim 4 wherein the aprotic solvent is tetrahydrofuran.

6. The process of claim 4 wherein the aprotic solvent is toluene.

7. The process of claim 1 wherein the precursor is heated to a temperature of from about 50° C. to about 400° C.

8. The process of claim 7 wherein the precursor is heated to a temperature of from about 350° C. to about 400° C.

9. The process of claim 1 wherein the group III compound is dissolved in the aprotic solvent to form a solution and the group V compound is introduced thereto by bubbling the group V compound through the solution.

10. The process of claim 1 wherein the precursor is isolated prior to heating.

* * * * *